United States Patent
Gabel et al.

(10) Patent No.: US 6,170,695 B1
(45) Date of Patent: *Jan. 9, 2001

(54) INSTRUMENT WITH MULTIPLE POSITION SUPPORT HANDLE

(75) Inventors: Preston S. Gabel, Hillsboro; William R. Pooley, Aloha; Brian G. Russell, Tigard; Kenneth P. Dobyns, Beaverton, all of OR (US)

(73) Assignee: Tektronix, Inc., Beaverton, OR (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/099,860

(22) Filed: Jun. 18, 1998

(51) Int. Cl.$^7$ .................................................. B65D 25/00
(52) U.S. Cl. .......................... 220/756; 202/764; 202/4.02
(58) Field of Search .................................. 220/756, 760, 220/762, 763, 764, 765, 766, 773, 4.02

(56) References Cited

U.S. PATENT DOCUMENTS

| | | |
|---|---|---|
| 2,926,876 | 3/1960 | Rockwood, et al. . |
| 3,124,266 * | 3/1964 | Morgan .............................. 220/756 X |
| 3,155,362 | 11/1964 | McCall . |
| 3,284,151 * | 11/1966 | Morrison et al. ................ 220/4.02 X |
| 3,813,004 * | 5/1974 | Andreaggi .............................. 220/756 |
| 3,878,964 * | 4/1975 | Fogle ................. 220/765 X |
| 4,089,464 * | 5/1978 | Teti, Jr. et al. .................. 220/764 X |
| 4,196,821 * | 4/1980 | Teti, Jr. et al. .................. 220/764 X |
| 4,274,545 * | 6/1981 | Peroni ................................ 220/4.02 |
| 4,515,419 * | 5/1985 | Hampel et al. .................. 220/762 X |
| 5,396,399 * | 3/1995 | Blair et al. ........................ 220/756 X |

FOREIGN PATENT DOCUMENTS 0 319 656    9/1988  (EP) .

* cited by examiner

Primary Examiner—Steven Pollard
(74) Attorney, Agent, or Firm—Bennet K. Langlotz; Thomas F. Lenihan

(57) ABSTRACT

An electronic instrument with a housing having a front surface and a rear surface. A user interface is located on the front surface. A movable handle having a grip portion is connected to the housing and is movable between a first carrying position in which at least a portion of the grip is forward of the rear surface and a first stabilizing position in which at least a portion of the grip is rearward of the rear surface. The handle may movable to other stabilizing positions, and the housing may include a front prop to provide additional stability and alternative viewing angles.

2 Claims, 4 Drawing Sheets

US 6,170,695 B1

INSTRUMENT WITH MULTIPLE POSITION SUPPORT HANDLE

FIELD OF THE INVENTION

The invention relates to electrical instruments, and more particularly to portable instruments requiring multiple orientations for use.

BACKGROUND AND SUMMARY OF THE INVENTION

Portable electronic instruments such as oscilloscopes are often required to be portable for testing devices at various locations. Accordingly, they are typically provided with carrying handles. A typical configuration of portable oscilloscope has a rectangular front interface panel with a width substantially greater than its height. To accommodate a lengthy cathode ray tube (CRT), the instrument has an even greater depth than its width. The handle is typically a bail handle pivotally mounted to opposite side panels at positions near the front panel. The handle has arms that extend parallel to the side panels, with a cross member connecting the handle ends.

The handle may be moved among several positions, and has locking mechanisms at each pivot mount to secure the handle in any of several possible positions. When transporting the instrument, the handle is positioned with its arms extending perpendicular to the front panel, and the handle cross portion bisecting the front panel. Thus, the instrument may be carried as a suitcase, with the rear panel facing downward, and the center of the instrument in line with and below the handle for stability. With the pivot mounts being positioned nearer to the front panel than to the side panel, the instrument is stable without torsional stress applied to the pivot mounts.

The handle of the described conventional instrument may be positioned below the plane of the bottom panel to elevate the front panel and angle it somewhat upward from a vertical position. While the rear edge of the instrument rests on a bench surface, the front edge elevation and angle may be selected based on the angle of the handle below the plane of the instrument housing. When the instrument is to sit flat on a horizontal surface, the handle may be stowed by pivoting it to a position above the instrument, folded back until it contacts a rear portion of the upper surface of the instrument housing. The handle may also be removed for rack mounting. The limited arm length of the handle is adequate to provide knuckle clearance during carrying without being undesirably bulky or providing an excessively long lever arm to stress the locked pivot mounts.

In conventional instruments as described, the mass and lengthy front-to-rear "wheelbase" provides substantial stability even when buttons on the front panel are pressed with significant force by a user. However, current oscilloscope designs are much more compact and lightweight than traditional designs. In addition to miniaturization of many electronic components, the substitution of flat panel displays for bulky and heavy CRTs has radically changed product configurations. A typical current device may have a front panel with proportions similar to the conventional instrument described above, but with a much smaller housing depth. Whereas the depth was formerly typically the longest dimension, it may now be the smallest, as front panel area becomes a size-limiting constraint instead of the traditional volume or CRT length constraints. Further, the elimination of a fragile and heavy CRT has allowed the use of lighter housing and structural materials, drastically reducing the mass of such instruments, which formerly provided benchtop stability during use.

With lighter instruments and shallow housing depths comes a stability disadvantage. A user pressing a button or inserting a probe connector near the upper edge of an instrument's front panel may tend to tip the unit backwards. In addition, the use of a prop at the lower edge of the front panel to provide front elevation and a sometimes-preferred viewing angle for a user above the level of the instrument worsens the stability concern. Such props elevate the center of mass of the instrument, and shift it slightly rearward with respect to the lower rear edge of the housing, which serves as a fulcrum for stability purposes. Even when tipping is not a concern, existing compact instruments lack desired viewing angle versatility. Accordingly, there is a need for a compact instrument that can be positioned for a variety of useful viewing angles, and which is stable to resist tipping during use.

The embodiments disclosed herein overcome these limitations by providing an electronic instrument with a housing having a front surface and a rear surface. A user interface is located on the front surface. A movable handle having a grip portion is connected to the housing and is movable between a first carrying position in which at least a portion of the grip is forward of the rear surface and a first stabilizing position in which at least a portion of the grip is rearward of the rear surface. The handle may movable to other stabilizing positions, and the housing may include a front prop to provide additional stability and alternative viewing angles.

DETAILED DESCRIPTION OF A PREFERRED EMBODIMENT

Figure 1:
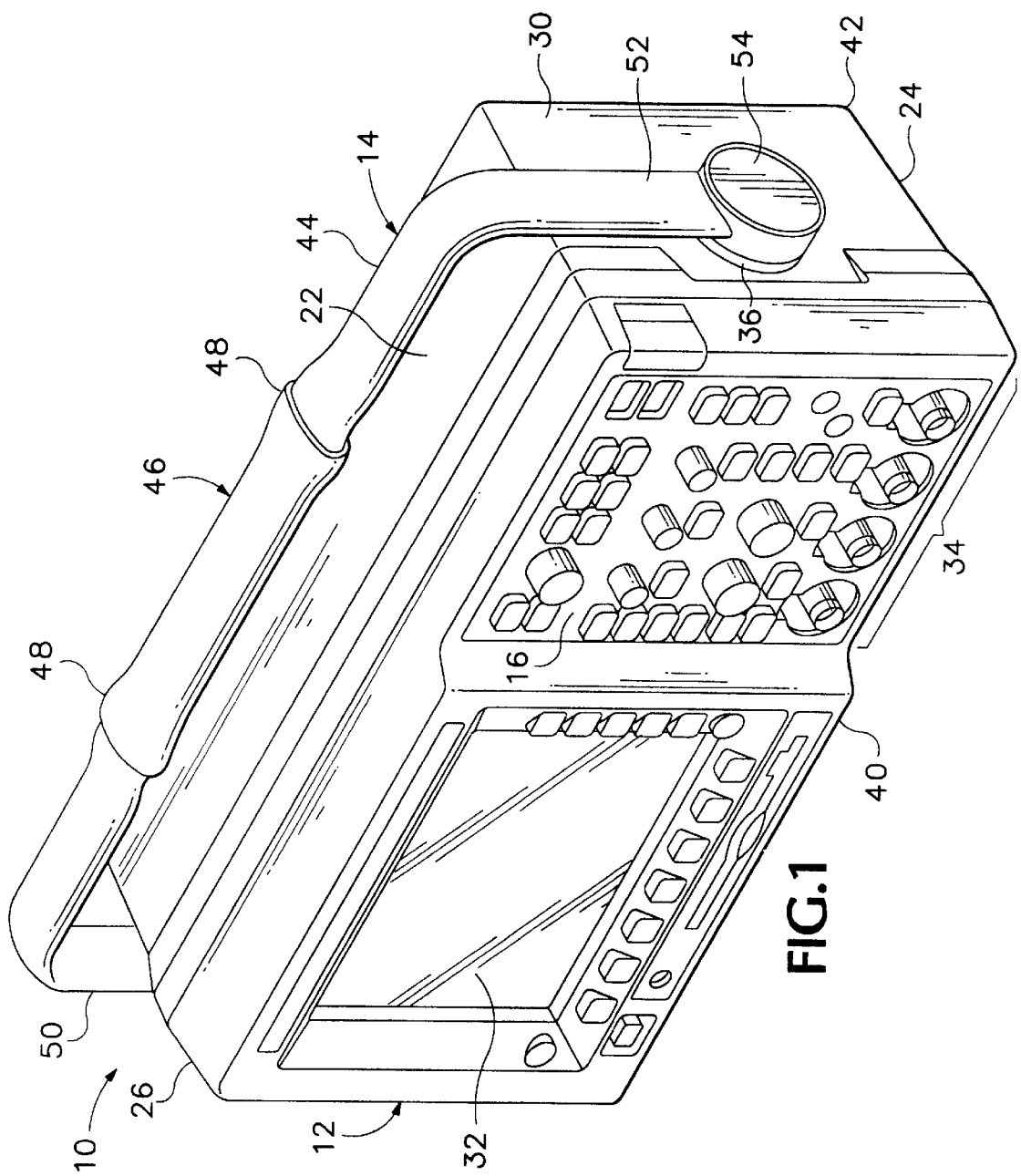
FIG. 1 is a perspective view of an instrument according to a preferred embodiment of the invention.

FIG. 1 shows a compact portable oscilloscope 10 having a housing 12 and a movable bail handle 14. The housing has a generally orthogonal box-like shape, with a front surface 16, a rear surface 20, top surface 22, bottom surface 24, and left and right side or end surfaces 26 and 30. A display screen 32 and interface panel 34 having numerous controls and lead connectors occupy the front panel. The side panels each have a central pivot boss 36 to support the handle 14.

The display screen 32 is a flat panel display having minimal intrusion into the chamber defined by the housing, permitting the housing to have a limited depth less than or comparable to the housing's height, and substantially less than the width of the housing. In the preferred embodiment, the housing has a width of 13", a depth of 6" and a height of 7". The generally box-like shape provides the bottom panel with a front edge 40 where it intersects the front panel 16, and a rear edge 42 where it intersects the rear panel 20. In the carrying position shown, with the bottom panel horizontal, and the handle in a vertically upward extending position, the front and rear edges provide some stability when the bottom panel rests directly on a flat surface.

The handle 14 is a hollow, rigid plastic elongated member having an oval cross section for torsional rigidity. The handle has an elongated cross member 44 extending the width of the housing and having a centrally located hand grip 46. The grip 46 has a resilient elastomeric surface that resists sliding on smooth surfaces when used as a support leg, and has an elongated central portion terminated by a pair of enlarged lobes 48 that are widely spaced apart by at least about one third the length of the handle. As will be discussed below, the spaced apart lobes provide two distinct points of contact when the handle is used as a support. The substantial spacing of the lobes will provide lateral stability in these instances.

A pair of arms 50, 52 extends perpendicularly from each end of the cross member to provide a bail shape. A pivot mechanism 54 is connected to the free end of each arm. Each pivot mechanism is connected to a respective boss 36 on the housing, and includes a limiter that prevents the handle from pivoting beyond a selected range of motion. The pivot mechanism also includes a stop, lock or detent mechanism, so that the handle is made stable in several selected different angular positions, as will be discussed below. In each of the stable positions, the handle resists movement in response to a limited force below a selected threshold, so that the weight of the instrument or forces associated with operation do not move the handle. A deliberate force, such as to unlock a stop, or to overcome a resistance are required to move the handle. The pivot, limit, and stop mechanisms may include components mounted on the arm and on the housing to operate in concert.

Figure 2:
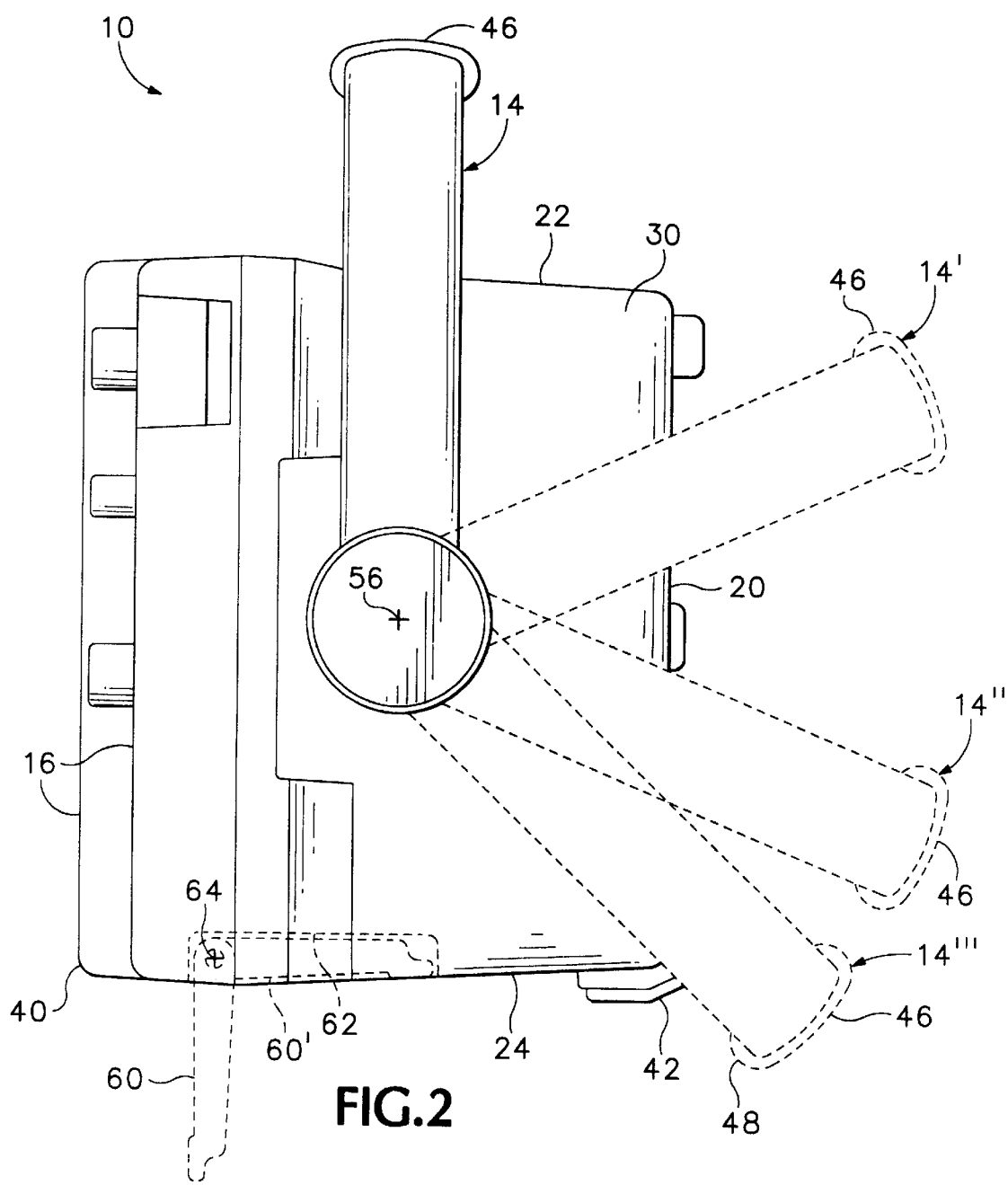
FIG. 2 is an end view of the instrument of FIG. 1 having a handle in a first position and the instrument in a first orientation.

FIG. 2 shows an end view of the instrument with several alternative handle positions in dashed lines. Handle 14 is shown in solid lines in the carrying position, extending vertically upward from a handle pivot axis 56 when the instrument is oriented upright for carrying or for placement of its bottom panel on a horizontal surface. In the carrying position, the handle extends parallel to the front surface of the housing, and is in its maximum forward position (maximum counter-clockwise rotation in the view shown) as limited by the limit mechanism.

As shown in dashed lines, the handle may be pivoted to several different stabilizing positions offset from the carrying position by different amounts. Each stabilizing position is intended for stably orienting the instrument in a different orientation, typically on a horizontal surface, with different orientations being useful for different viewing angles and different surface heights relative to the viewer. A first stabilizing position 14' is offset 65° from the carrying position in the rearward and downward direction (clockwise in the illustration). Because this is an acute angular displacement, the first handle position 14' is above the horizontal, and the handle grip 46 is above the pivot axis 56 which approximates the center of mass of the instrument.

A second stabilizing position 14" is offset 113° from the carrying position in the rearward and downward direction (clockwise in the illustration). This obtuse angular displacement provides a substantial rearward extension behind the rear panel, with adequate proximity to the plane of the bottom panel as will be discussed below.

A third stabilizing position 14''' is offset 134° from the carrying position in the rearward and downward direction (clockwise in the illustration). This greater obtuse angular displacement provides some rearward extension behind the rear panel, with a portion of the lobes 48 of the handle grip 46 extending below the plane of the bottom panel.

The housing also includes a pair of props 60, which are foldable legs that extend below the bottom panel when in an extended position, and which stow in bottom panel recesses 62 when in a recessed position 60'. The props are positioned near the front housing edge 40 for elevating the front panel and tilting the housing backward for viewing. The props are widely spaced apart near the end panels to provide lateral stability. The prop pivot axis 64 is located at the forward end of the stowed prop, so that the prop unfolds forward as it extends. This make the extended prop stable against forces applied to the front panel such as while pressing buttons.

Figure 3:
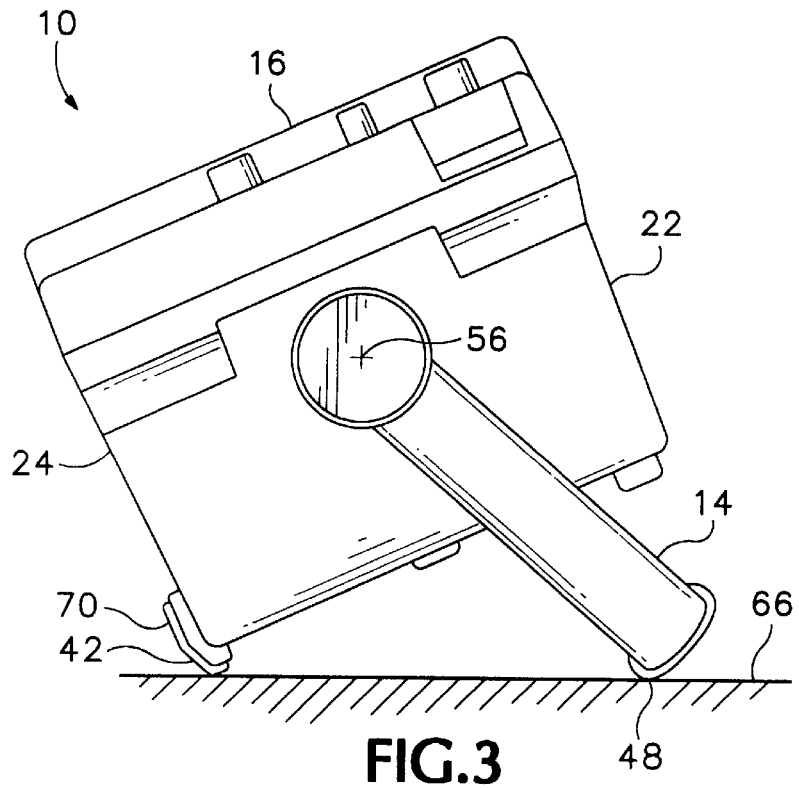
FIG. 3 is an end view of the instrument of FIG. 1 having a handle in a second position and the instrument in a second orientation.

FIG. 3 shows the instrument 10 in a first stable orientation with the handle 14 in the first position 14' discussed above, and with the props retracted. In this position, the instrument has its elastomeric feet 70 at the rear edge 42 resting on the surface, as are the lobes 48 of the handle grip. The center of mass and of arm pivoting 56 is positioned between these points of contact, providing stability. The elevation of the center of mass is approximately equal to the lateral distance of the lobe contact points from the center of mass, providing strong resistance to rearward tipping in response to forces on the front face. The ratio for the lateral offset of the feet contact point is at least about one half the center of mass' elevation. The distance between points of contact is greater than the elevation of the center of mass. In this position, the front face is offset by 24° from the horizontal, making the position useful for a viewer whose eye level is well above the instrument, such as for a user standing near a desktop on which the instrument rests.

Figure 4:
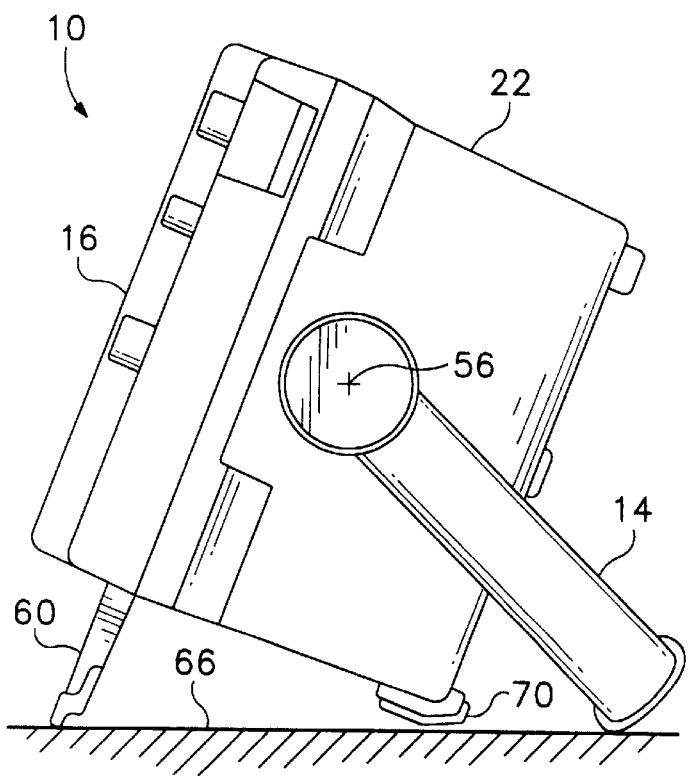
FIG. 4 is an end view of the instrument of FIG. 1 having a handle in a third position and the instrument in a third orientation.

FIG. 4 shows the instrument 10 in a second stable orientation with the handle 14 in the second position 14" discussed above, and with the props 60 extended. In this position, the instrument is resting on the surface 66 with the free ends of the props providing support at the front of the instrument, and the handle grip lobes 48 providing support at the rear of the instrument. The rear edge feet 70 are just above the surface 66, as the spread or "wheel base" is maximized and the center of mass elevation minimized. The center of mass and of arm pivoting 56 is positioned between these points of contact, providing stability. The elevation of the center of mass is approximately 125% of the lateral distance of the lobe contact points from the center of mass, providing strong resistance to rearward tipping in response to forces on the front face. The ratio for the lateral offset of the prop contact point is comparable. The distance between points of contact is greater than the elevation of the center of mass, and greater than the depth of the instrument. In this position, the front face is offset by 22° from the vertical, making the position useful for a viewer whose eye level is moderately above the instrument, such as for a taller user seated at a desk top on which the instrument rests.

Figure 5:
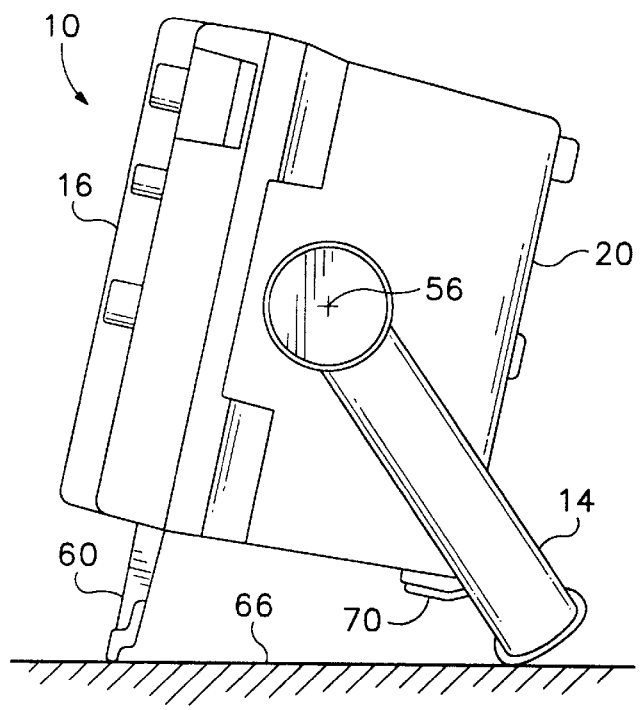
FIG. 5 is an end view of the instrument of FIG. 1 having a handle in a fourth position and the instrument in a fourth orientation.

FIG. 5 shows the instrument 10 in a third stable orientation with the handle 14 in the third position 14''' discussed above, and the props 60 extended. In this position, the instrument is resting on the surface 66 with the free ends of the props providing support at the front of the instrument, and the handle grip lobes 48 providing support at the rear of the instrument. In contrast to the second orientation of FIG.

4, the instrument rear edge is elevated to provide a lower viewing angle, with the rear edge feet 70 spaced above the surface. The center of mass and of arm pivoting 56 is positioned approximately centrally between these points of contact, providing stability. The elevation of the center of mass is less than double the lateral distance of the lobe contact points from the center of mass, providing strong resistance to rearward tipping in response to forces on the front face. The ratio for the lateral offset of the prop contact point is comparable. The distance between points of contact is greater than the elevation of the center of mass, and comparable to the depth of the instrument. In this position, the front face is offset by 12° from the vertical, making the position useful for a viewer whose eye level is slightly above the instrument. In this position, the handle is at the maximum excursion from the carrying position, and is limited by the limit mechanism.

Figure 6:
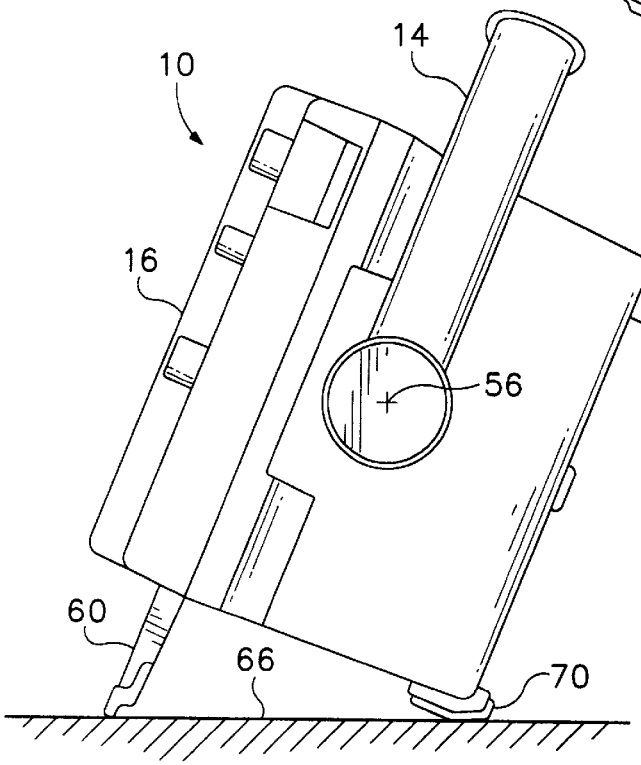
FIG. 6 is an end view of the instrument of FIG. 1 having a handle in the first position and the instrument in a fifth orientation.

FIG. 6 shows the instrument 10 in a fourth stable orientation with the handle 14 in the carrying position, and the props 60 providing elevation of the front edge while the rear edge feet 70 rest on the surface 66. The center of mass and of arm pivoting 56 is positioned between these points of contact. The elevation of the center of mass is about triple the lateral distance of the feet contact points from the center of mass, providing some limited resistance to rearward tipping in response to moderate forces on the front face, making the position useful where tipping is not a significant concern, or when rapid deployment without adjusting the handle is desired. The ratio for the lateral offset of the prop contact point is about 80%. The distance between points of contact is greater than the elevation of the center of mass, and nearly as great as the depth of the instrument. In this position, the front face is offset by 22° from the vertical, making the position useful for a viewer whose eye level is slightly above the instrument.

Figure 7:
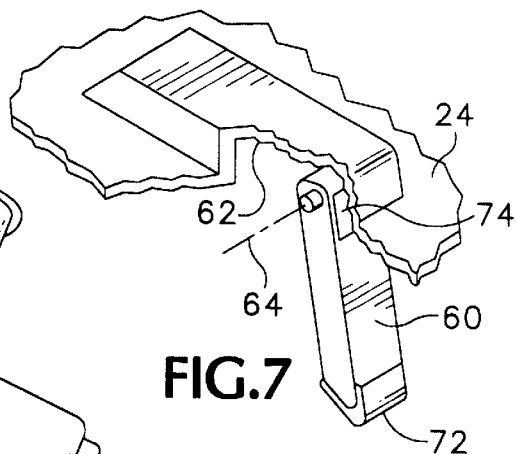
FIG. 7 is an enlarged fragmentary view of a prop leg of the instrument of FIG. 1.

FIG. 7 shows the details of the prop elements 60. In particular, the props are provided with an elastomeric toe surface 72 at the free end, which wraps about the end of the prop to make it resist slipping on a smooth support surface. An elastomeric pad 74 is applied to the forward facing surface of the prop near the pivot end to provide a cushion where the prop contacts the edge of the bottom housing panel 24 at the front edge of the recess. This cushion reduces wear, deformation, and the risk of breakage if the extended prop is subject to an upward or forward force, such as may occur inadvertently during use of a portable instrument. The props may alternatively be formed without the rubber portions, for lower cost applications, or where the force required to retract the prop is relatively small, and there is a concern that sliding the instrument forward on a typical surface will cause unintended collapse of the prop instead of sliding of the toe. In these circumstances, a tow with an intermediate friction coefficient may be selected, or the detent mechanism holding the prop in the extended position may be modified to provide greater resistance to collapse.

While the disclosure is made in terms of a preferred embodiment, the invention is not intended to be so limited. For instance, the handle may be designed to provide additional stop positions, or may be made continuously adjustable for an infinite rage of positions. These ranges may be provided for the cases when the rear edge and handle provide support and when the props and handle provide support, for instance. The illustrated angles and positions are shown as currently preferred, but are not intended to be limiting. In addition, the instrument may be used resting on its back with the movable handle providing no obstruction to placement or viewing.

What is claimed is:

1. An electronic instrument comprising:

an instrument housing;

a movable handle connected to the housing;

the handle movable between a first carrying position, a first stabilizing position, and a second stabilizing position;

a pivot member connected to the housing and operable to resist displacement of the handle from a selected one of the first carrying position, the first stabilizing position, and the second stabilizing position, in response to a force less than a selected threshold.;

a movable prop connected to the housing and movable between a retracted position and an extended position;

wherein the housing has a front surface with a user interface, said front surface having a height dimension and a width dimension, a lower surface having said width dimension and a depth dimension, and a rear surface, and wherein the prop has an end portion that extends below the front surface and adjacent the front surface when in the extended position, such that the front surface is elevated when the prop rests on a flat surface;

wherein said height dimension and said width dimension are greater than said depth dimension; and wherein a portion of the handle extends rearward of the rear surface of the housing when the handle is in the first stabilizing position, such that the end portion of the prop and the handle portion are spaced apart by a distance greater than the distance between the front surface and the rear surface of the housing.

2. The instrument of claim 1 wherein the housing has a front surface with a user interface, a lower surface, and a rear surface, and wherein the prop has an end portion that extends below the front surface and adjacent the front surface when in the extended position, such that the front surface is elevated when the prop rests on a flat surface.

* * * * *